(12) United States Patent
Choy et al.

(10) Patent No.: US 11,973,174 B2
(45) Date of Patent: Apr. 30, 2024

(54) LED DISPLAYS FABRICATED USING HYBRID BONDING

(71) Applicant: TECTUS CORPORATION, Saratoga, CA (US)

(72) Inventors: Henry Choy, Saratoga, CA (US); Paul Martin, Saratoga, CA (US)

(73) Assignee: TECTUS CORPORATION, Saratoga, CA (US)

( * ) Notice: Subject to any disclaimer, the term of this patent is extended or adjusted under 35 U.S.C. 154(b) by 0 days.

(21) Appl. No.: 18/206,760

(22) Filed: Jun. 7, 2023

(65) Prior Publication Data

US 2023/0317911 A1 Oct. 5, 2023

Related U.S. Application Data

(63) Continuation of application No. 17/215,767, filed on Mar. 29, 2021, now Pat. No. 11,721,796.

(51) Int. Cl.
| | |
|---|---|
| *H01L 33/62* | (2010.01) |
| *H01L 25/075* | (2006.01) |
| *H01L 33/50* | (2010.01) |
| *H01L 33/32* | (2010.01) |

(52) U.S. Cl.
CPC .......... *H01L 33/62* (2013.01); *H01L 25/0753* (2013.01); *H01L 33/505* (2013.01); *H01L 33/32* (2013.01); *H01L 2933/0041* (2013.01); *H01L 2933/0066* (2013.01)

(58) Field of Classification Search
CPC ............................. H01L 33/62; H01L 25/0753
See application file for complete search history.

(56) References Cited

U.S. PATENT DOCUMENTS

| | | | |
|---|---|---|---|
| 4,268,842 | A | 5/1981 | Jacob |
| 4,408,217 | A | 10/1983 | Kobayashi |
| 4,608,581 | A | 8/1986 | Bagratishvili |
| 4,707,726 | A | 11/1987 | Tinder |
| 5,534,444 | A | 7/1996 | Nissim |
| 6,023,076 | A | 2/2000 | Shibata |
| 6,233,265 | B1 | 5/2001 | Bour |
| 6,410,940 | B1 | 6/2002 | Jiang |
| 7,592,637 | B2 | 9/2009 | Zimmerman |
| 8,058,663 | B2 | 11/2011 | Fan |
| 8,552,436 | B2 | 10/2013 | Bibl |
| 9,041,025 | B2 | 5/2015 | Lau |
| 9,047,818 | B1 | 6/2015 | Day |
| 9,196,653 | B2 | 11/2015 | Leatherdale |

(Continued)

FOREIGN PATENT DOCUMENTS

| | | |
|---|---|---|
| WO | 2009143802 A1 | 12/2009 |
| WO | 2011029935 A2 | 3/2011 |

(Continued)

OTHER PUBLICATIONS

Choi, H.W. et al., "High-Resolution 128×96 Nitride Microdisplay," IEEE Electron Device Letters, May 2004, vol. 25, No. 5., pp. 277-279.

(Continued)

*Primary Examiner* — Andrew J Coughlin

(57) ABSTRACT

High-density GaN-based LED displays fabricated using wafer-to-wafer hybrid bonding and incorporating s color conversion region are disclosed.

18 Claims, 20 Drawing Sheets

(56) References Cited

U.S. PATENT DOCUMENTS

| | | |
|---|---|---|
| 10,388,641 B2 * | 8/2019 | Martin .................. H01L 24/13 |
| 2006/0055309 A1 | 3/2006 | Ono |
| 2008/0128728 A1 | 6/2008 | Nemchuk |
| 2009/0140272 A1 | 6/2009 | Beeson |
| 2009/0162959 A1 | 6/2009 | Hsu |
| 2010/0060553 A1 | 3/2010 | Zimmerman |
| 2011/0226937 A1 | 9/2011 | Yu |
| 2012/0074424 A1 | 3/2012 | Lee |
| 2012/0154876 A1 | 6/2012 | Shimoda |
| 2012/0205613 A1 | 8/2012 | Mi |
| 2012/0223875 A1 | 9/2012 | Lau |
| 2012/0276701 A1 | 11/2012 | Yedinak |
| 2013/0075848 A1 | 3/2013 | Nikolic |
| 2013/0126827 A1 | 5/2013 | Bibl |
| 2013/0187056 A1 | 7/2013 | Nikolic |
| 2014/0070263 A1 | 3/2014 | Choi |
| 2014/0225524 A1 | 8/2014 | Saadeh |
| 2016/0163918 A1 | 6/2016 | Dasgupta |
| 2016/0356901 A1 | 12/2016 | Shao |
| 2017/0069612 A1 | 3/2017 | Zhang |
| 2017/0294418 A1 | 10/2017 | Edmond |
| 2018/0120568 A1 | 5/2018 | Miller |
| 2018/0151543 A1 | 5/2018 | Lee |
| 2018/0261736 A1 | 9/2018 | Bonar |
| 2019/0058080 A1 * | 2/2019 | Ahmed .................. H01L 24/00 |
| 2019/0179222 A1 | 6/2019 | Choy |
| 2019/0295996 A1 | 9/2019 | Park |
| 2022/0310892 A1 | 9/2022 | Choy |

FOREIGN PATENT DOCUMENTS

| | | |
|---|---|---|
| WO | 2016079505 A1 | 5/2016 |
| WO | 2017217703 A1 | 12/2017 |

OTHER PUBLICATIONS

Day, J. et al., "Ill-Nitride Full-Scale High-Resolution Microdisplays," Applied Physics Letters, 2011, vol. 99, No. 031116, 2 pages.

Henry, W., "MicroLED Arrays Find Applications in the Very Small," Photonics Media, Mar. 2013, 7 pages.

Hernsdorf, J. et al., "Active-Matrix GaN Micro Light-Emitting Diode Display with Unprecedented Brightness," IEEE Transactions on Electron Devices, Jun. 2015, vol. 62, No. 6, pp. 1918-1925.

International Search Report and Written Opinion for PCT/US2022/021557, Jul. 4, 2022 (122 pages).

Kang, C-M. et al., "Fabrication of a Vertically-Stacked Passive-Matrix Micro-LED Array Structure for a Dual Color Display," Optics Express, Feb. 6, 2017, vol. 25, No. 3, 7 pages.

* cited by examiner

LED DISPLAYS FABRICATED USING HYBRID BONDING

This application is a continuation of U.S. application Ser. No. 17/215,767, filed on Mar. 29, 2021, now allowed, which is incorporated by reference in its entirety.

FIELD

The disclosure relates to high density GaN-based LED displays fabricated using wafer-to-wafer hybrid bonding and incorporating a color conversion region.

BACKGROUND

Fabricating high density LED displays that can be integrated into ocular devices such as contact lenses present unique challenges.

BRIEF DESCRIPTION OF THE DRAWINGS

The drawings described herein are for illustration purposes only. The drawings are not intended to limit the scope of the present disclosure.

DETAILED DESCRIPTION

According to the present invention, high-density light emitting diode (LED) displays comprise a color conversion region overlying a high-density LED array. The LED arrays are fabricated using hybrid wafer-to-wafer bonding to bond and interconnect a backplane interconnection water to an LED frontplane wafer. After bonding the backplane and frontplane wafer, an LED array can be fabricated. A color conversion region can then be fabricated overlying the integrated LED array to provide a high-density LED display.

An example of a process for fabricating a high-density LED display is shown in FIGS. 1A-3B.

Figure 1A:
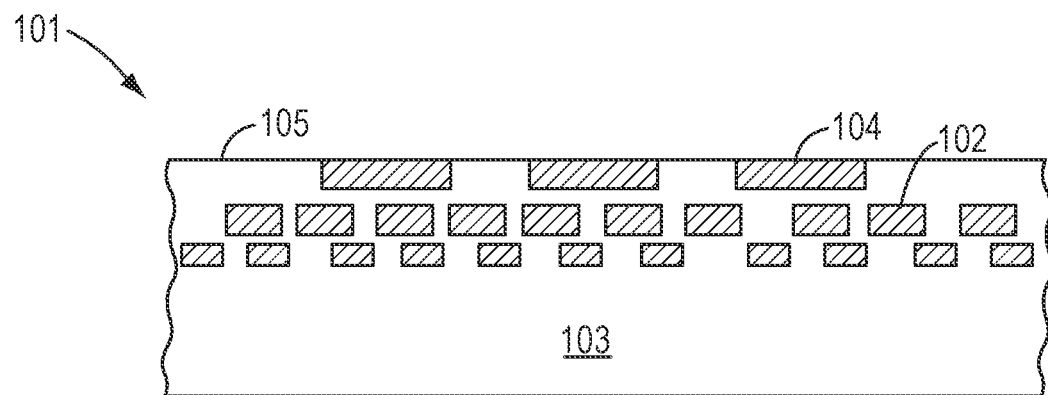
FIGS. 1A and 1B show cross-sectional views of semi-conductor structures used to fabricate a backplane wafer.

FIG. 1A shows a backplane substrate 101 such as a silicon CMOS substrate including conductive features 102 such as traces, interconnects, and vias embedded within a dielectric region 103 and contact pads 104 adjoining the upper surface 105. The backplane substrate 101 can include LED driver circuits (not shown) and contact pads 104 for making electrical interconnection between the LED driver circuits and respective GaN-based LED p-contacts. Certain contact pads can provide electrical interconnection between a common cathode and each of the LEDs n-contacts.

Figure 1B:
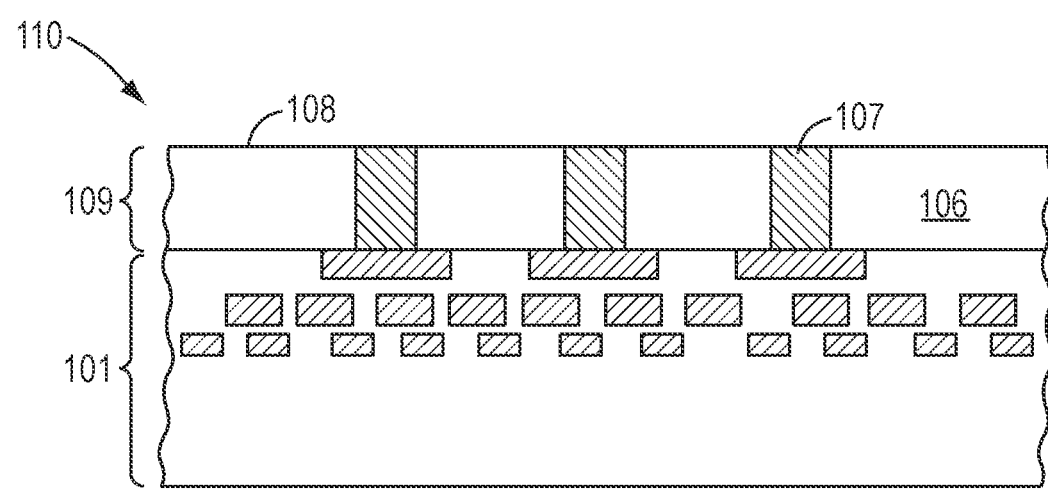

A dielectric region 106 such as a $SiO_2$ or $SiN_x$ region can be deposited on the backplane substrate 101 and overlying the contact pads 104 as shown in FIG. 1B.

FIG. 1B shows a cross-sectional view of an example of a backplane wafer 110 including backplane substrate 101 and overlying backplane interconnection region 109.

Overlying refers to a configuration in which one region is adjacent another layer. An overlying region can adjoin an underlying region without any intervening regions or layers. Alternatively, there can be one or more regions or layers between an overlying region and an underlying region. A region can comprise a single material layer or can comprise more than one material layer. A region or a layer within a region can comprise a substantially homogenous elemental composition or the elemental composition within a layer can vary, for example, continuously or discontinuously, within the thickness of a region or layer and/or within the plane of a region or a layer.

Referring to FIG. 1B, the thickness of the dielectric region 106 can be, for example, less than 6 μm, or less than 3 μm, such as from 1 μm to 3 μm. Vias 107 can be etched through the dielectric region 106 to expose the contact pads 104 using any suitable process. The vias 107 can then be filled with a conductive material such as copper, a copper alloy, gold, silver, or a silver alloy to form vertical interconnects or vias to respective contact pads 104. The upper surface 108 can then be planarized using any suitable process such as chemical-mechanical polishing (CMP) to provide a planar surface 108. The deposition of the dielectric region 106, and the etching, filling and polishing steps can be repeated to provide a desired aspect ratio for the vertical interconnects 107. For example a vertical interconnect 107 can have an aspect ratio (height:width) from 1:1 to 10:1, such as from 1:1 to 5:1, or from 1:1 to 3:1.

Figure 2A:
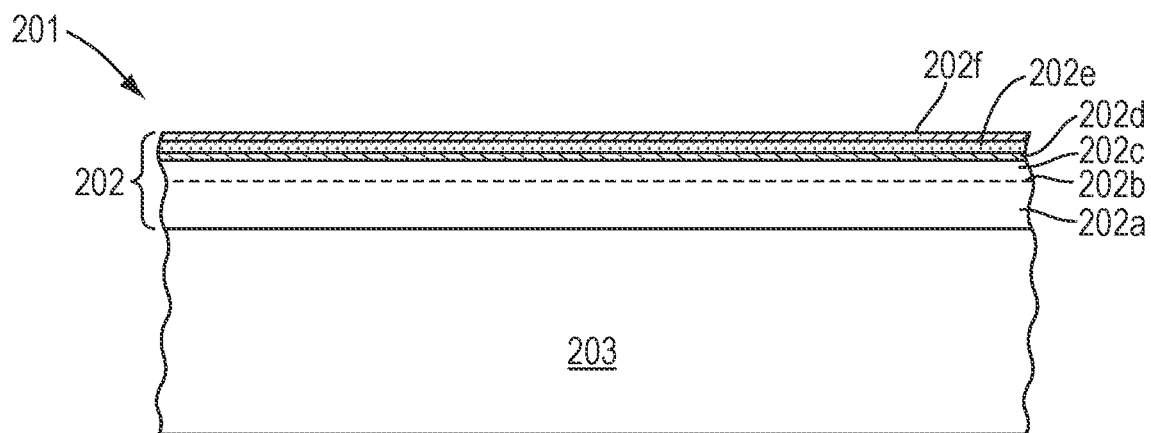
FIGS. 2A and 2B show cross-sectional views of semi-conductor structures used to fabricate a GaN-based LED frontplane wafer.
Figure 2B:
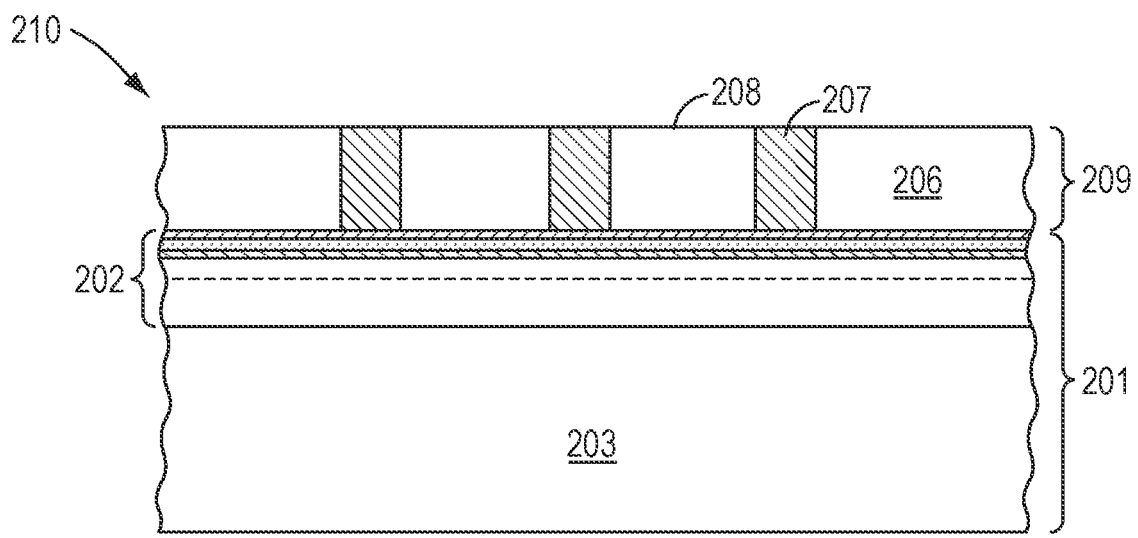

FIG. 2B shows a cross-sectional view of an example of a GaN-based LED frontplane wafer 210 including GaN-based LED region 202 and GaN-based LED interconnection region 209.

FIGS. 2A-2B show examples of process steps for fabricating a GaN-based LED frontplane wafer. GaN-based LED region 202 can be epitaxially grown on a suitable substrate 203 such a silicon, sapphire, or silicon carbide substrate to provide GaN-based LED backplane wafer 201. GaN-based LED region 202 can include a buffer region (not shown), an n-doped GaN region 202a, an active GaN region 202b, and a p-doped GaN region 202c. GaN-based LED region 202 can have a thickness, for example, from 3 μm to 6 μm such as from 4 to 6 μm or from 5 μm to 6 μm. A p-contact metal region 202d can overly the p-doped GaN region 202c and can provide electrical contact to the p-doped GaN region 202c. A p-contact metal region 202d can comprise, for example, a conductive oxide such as indium tin oxide (ITO), silver, palladium, nickel, and/or gold. A reflective metal region 202e such as an aluminum, iridium, or ruthenium layer can overlie p-contact metal region 202d. A barrier metal 202f such as titanium nitride, chromium, tantalum, tantalum nitride, tungsten nitride, a titanium tungsten alloy and/or ruthenium can overlie reflective metal region 202e.

As shown in FIG. 2B, an dielectric region 206 comprising, for example, $SiO_2$ or $SiN_x$, can be deposited overlying the epitaxial GaN-based LED region 202 to a thickness, for example, less than 4 μm or less than 3 μm, such as from 1 μm to 3 μm. Vias 207 can then be etched through the dielectric region 206 to expose portions of the epitaxial GaN-based LED region 202. The vias 207 can then be filled with an electrically conductive material such as copper, a copper alloy, silver, a silver alloy, or gold to provide vertical interconnects or vias 207. The surface 208 can then be planarized using any suitable method such as chemical-mechanical polishing. The steps of depositing the dielectric region, etching, filling, and planarizing can be repeated to provide a desired aspect ratio for the vertical interconnects 207 to the GaN-based LED region 202. For example a vertical interconnect 207 can have an aspect ratio (height:width) from 1:1 to 10:1, such as from 1:1 to 5:1, or from 1:1 to 3:1.

Figure 3A:
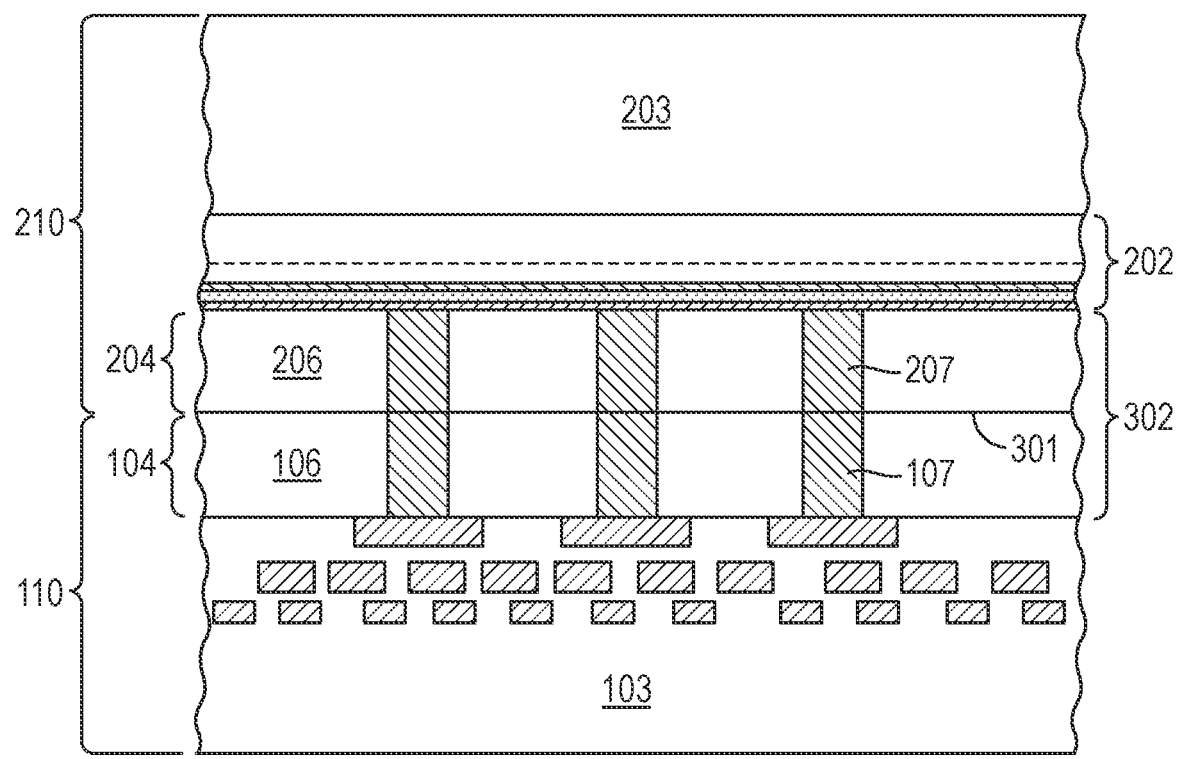
FIGS. 3A and 3B show cross-sectional views of semi-conductor structures used to integrate a backplane wafer and a GaN-based LED backplane wafer and to provide a high-density LED array.

The backplane wafer 110 and the GaN-based LED frontplane wafer 210 can then be bonded using wafer-to-wafer hybrid bonding such that the backplane wafer vertical interconnects 107 are aligned with respective frontplane wafer interconnects 207 as shown in FIG. 3A.

Forming the bonding surfaces can include finishing the backplane surface 108 and frontplane surface 208 to meet dielectric roughness specifications and metal layer recess specifications suitable for hybrid bonding. For example, surfaces 108/208 can be plasma activated in preparation for wafer-to-wafer hybrid bonding.

The backplane interconnection region 104 and the frontplane interconnection region 204 can be bonded and interconnected using hybrid bonding techniques.

Hybrid bonding can generally include wafer cleaning and activation, high-precision alignment of contacts of one wafer with contacts of another wafer, dielectric bonding of dielectric materials at the surfaces of the wafers at room temperature, and metal bonding of opposing interconnects by annealing at elevated temperature. A bonding layer can include dielectric regions and metal-filled vias. Dielectric materials of the dielectric regions can include, for example, SiCN, $SiO_2$, SiN, $Al_2O_3$, $HfD_2$, $ZrO_2$, $Ta_2O_5$. The bonding surface can be planarized and polished using, for example, chemical mechanical polishing, where the planarization or polishing can cause dishing or a concave profile across the metal-filled vias. The bonding surfaces can be cleaned and activated by exposure, for example, to an ion or fast atom beam such as a plasma ion or fast Ar atom flux. The activated surface can be atomically cleaned and can be reactive for formation of direct bonds between the surfaces when brought into contact, for example, at room temperature.

In a process for bonding the hybrid bonding surfaces, after the bonding surfaces are planarized and activated the frontplane and backplane wafers can be aligned and can be brought into physical contact. Compression pressure can be applied to the frontplane and backplane wafers such that the hybrid bonding surfaces are pressed against each other. Due to the surface activation and the dishing in the metal-filled vias, the opposing dielectric regions can be in direct contact as the result of a surface attractive force, and can react and form chemical bonds between the opposing surfaces resulting, for example, from the reaction of reactive dangling bonds caused by the surface activation. The dielectric materials in the opposing interconnection regions can be bonded together with or without heat treatment or pressure.

The bonded interconnection regions can be subjected to an annealing process for bonding the metal-filled vias in the opposing interconnection regions after bonding the dielectric materials in the opposing interconnection regions. For example, opposing metal-filled vias can be bonded together by annealing at, for example, temperatures within a range from 200° C. to 400° C., or at temperatures higher than 400° C. During the annealing process, due to the differences in the thermal expansion coefficient, the metal in the metal-filled vias can expand more than the dielectric material and thereby cause the dish shaped profile of the metal to expand do contact the metal in the opposing metal-filled via and form a direct metal interconnect.

FIG. 3A shows a semiconductor structure in which a backplane wafer 110 is directly bonded at wafer-to-wafer hybrid bonding interface 301 to a GaN-based LED frontplane wafer 210. Vertical interconnects 107 and 207 are aligned within interconnection region 302 and hybrid bonding interface 301. Interconnection region 302 includes backplane interconnect region 104 and GaN-based LED frontplane interconnect region 204 separated by bonding interface 301. Backplane wafer 110 includes interconnection region 104 including metal-filled vias 107 and dielectric 106, overlying backplane substrate 103. Frontplane wafer 210 includes substrate 203, epitaxial GaN-based LED epitaxial region 202, and frontplane interconnection region 204 including metal-filled vias 207 and dielectric 206.

After bonding, the GaN-based LED frontplane substrate 203 can be removed using, for example, by chemical mechanical polishing and/or blanket dry etching or laser liftoff to expose the underlying GaN-based LED region 202. A portion of the GaN-based LED region 202 can be removed such that the GaN-based LED region 202 has a thickness, for example, less than 6 μm such as less than 3 μm, such as from 1 μm to 3 μm. A microstructure can be etched into the upper surface of the GaN-based LED region 202 to improve coupling of radiation from GaN-based LEDs into an overlying color conversion region.

Figure 3B:
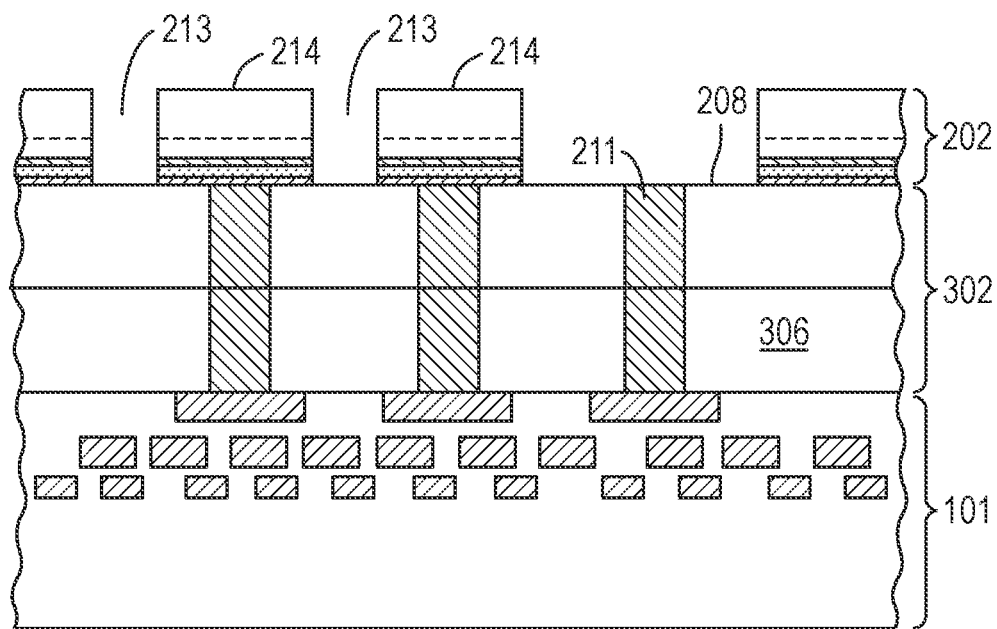

The thinned GaN-based LED region 202 can then be patterned into individual LEDs to provide the semiconductor structure shown in FIG. 3B. A deep etch can be performed through the GaN-based LED region 202 to provide a plurality of isolated GaN-based LEDs 214. The etch can stop at the surface 208 of the $SiN_x/SiO_2$ dielectric region 306 of interconnection region 302 and can expose common cathode vias 211 interconnected to backplane substrate 101.

The trenches 213 between the individual GaN-based LEDs 214 can have a width, for example, of less than 0.4 μm, less than 0.3 μm, less than 0.2 μm, or from 0.2 μm to 0.3 μm. A GaN-based LED can have a height, for example, of less than 4 μm, such as from 2 μm to 4 μm, or from 2.5 μm to 3.5 μm.

FIGS. 4A-4F show examples of additional processing steps that can be used to fabricate a high-density LED display provided by the present disclosure.

Figure 4A:
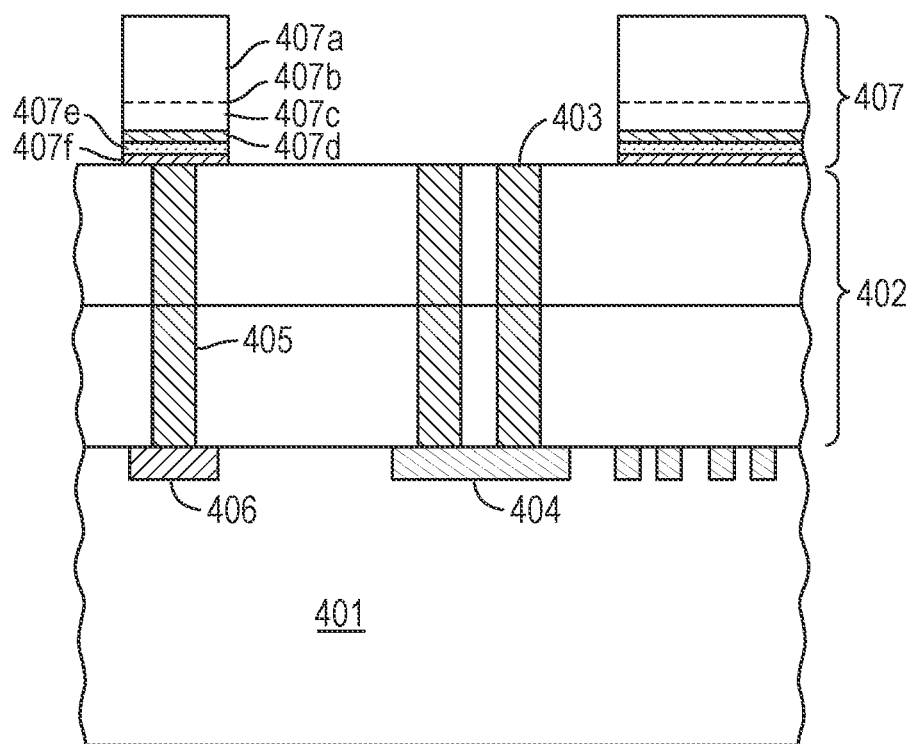
FIGS. 4A-4F show cross-sectional views of semiconductor structures used fabricate a high-density LED display provided by the present disclosure.

FIG. 4A shows a semiconductor structure including a backplane substrate 401, interconnection region 402, common cathode interconnects 403 electrically connected to cathode contacts 404, GaN-based LED interconnects 405 connecting a GaN-based LED 407 to a respective anode contact pad 406. GaN-based LEDs 407 include n-doped GaN region 407a, active GaN region 407b, p-doped GaN region 407c, p-contact metal region 407d, reflective metal layer 407e, and barrier metal 407f.

Figure 4B:
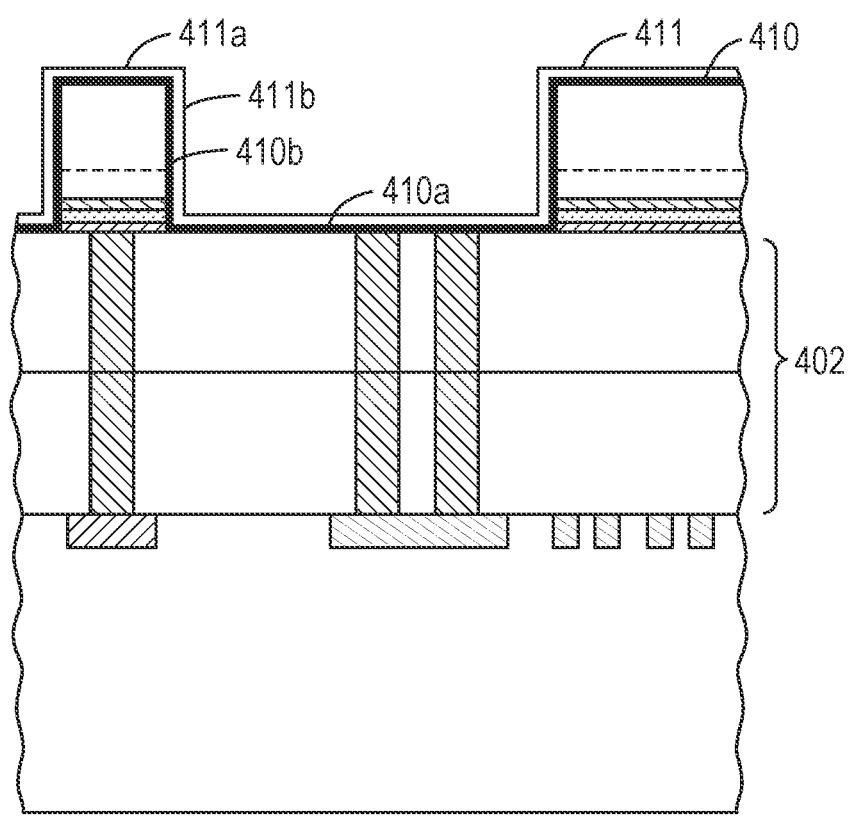

As shown in FIG. 4B, a dielectric region 410 can be deposited overlying the surfaces of the GaN-based LEDs 407 and the interconnection region 402 using, for example, atomic vapor deposition. The dielectric region 410 can comprise a dielectric material such as $Al_2O_3$, $TiO_2$, $SiO_2$, $SiN_x$, $HfO_x$, or $NbO_x$. The dielectric region 410 can have a thickness, for example, less than 1 μm. A portion of dielectric region 410 can be deposited on the upper, horizontal surface 410a of each of the GaN-based LEDs and on the vertical sidewalls 410b of each of the GaN-based LEDs. A reflective metal region 411 can be deposited overlying both the horizontal 411a and vertical 411b portions of the dielectric region 410.

Figure 4C:
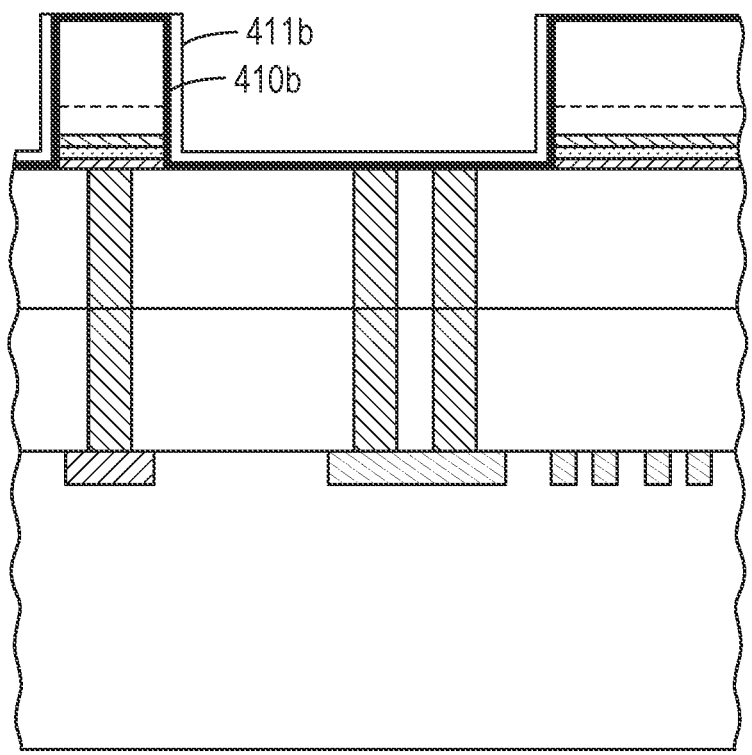

The portions of dielectric region 410 and reflective metal region 411 on the horizontal surfaces of the semiconductor structure can then be removed to provide the semiconductor structure shown in FIG. 4C. Directional etching can be used to remove the dielectric region 410a and the reflective metal region 411a from the horizontal surfaces leaving the dielectric region 410b and the reflection region 411b on the sidewalls of the GaN-based LEDs. The dielectric layer 410b on the vertical sidewalls of the GaN-based LEDs can prevent shorting between adjacent GaN-based LEDs. Reflective metal region 411b can serve to direct incident and emitted radiation toward the aperture of the GaN-based LEDs.

Figure 4D:
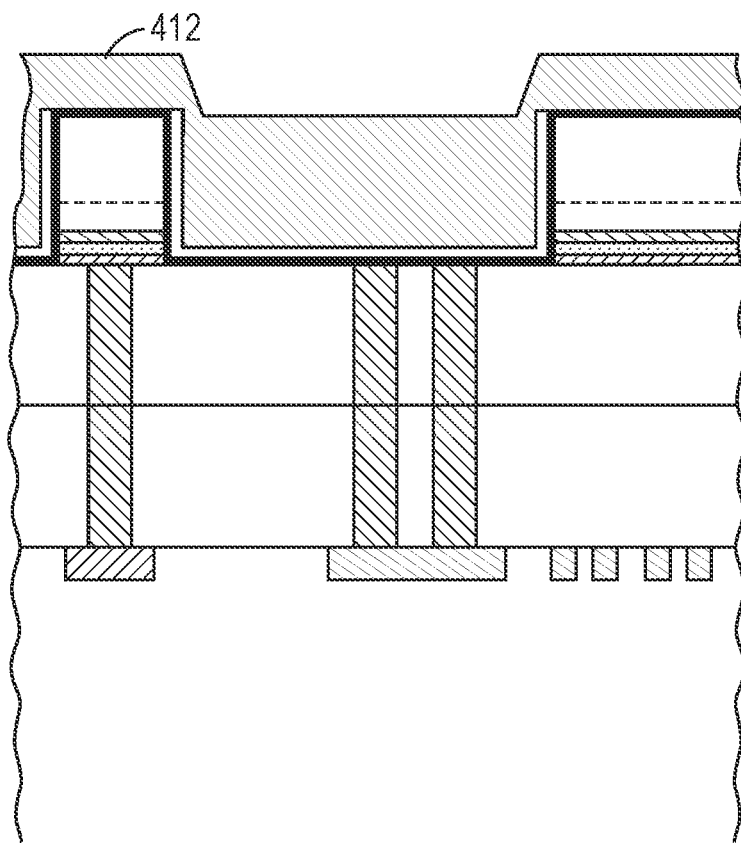
Figure 4E:
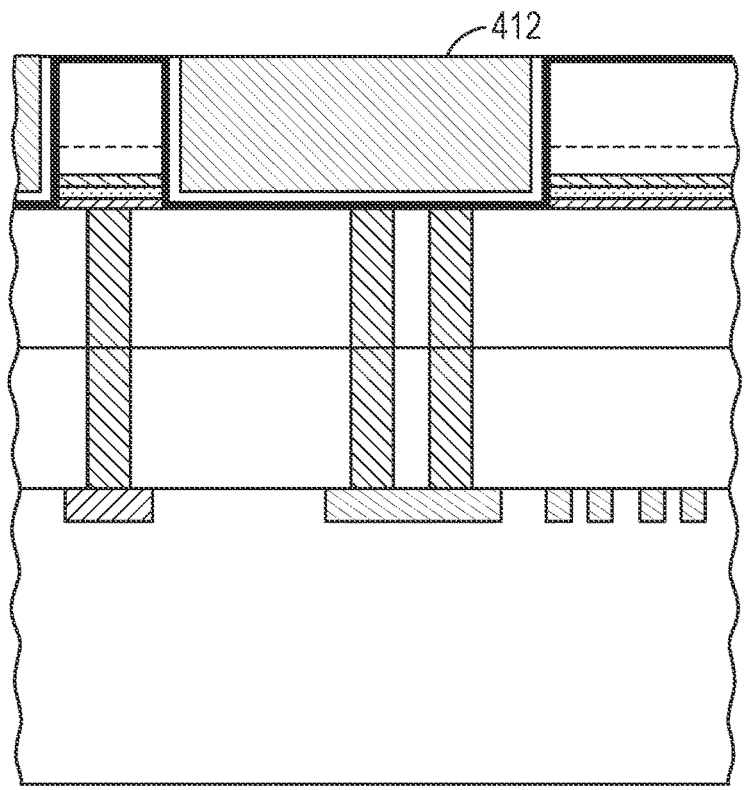

An electrically conductive metal 412 such as copper, a copper alloy, silver, a silver alloy, or gold can then be deposited onto the semiconductor structure shown in FIG. 4C to fill the trenches between the GaN-based LEDs and to fill the trenches overlying the common cathode metal-filled vias to provide the structure shown in FIG. 4D. The semiconductor structure can be planarized using any suitable method such as chemical-mechanical polishing to expose the GaN surface of each of the LEDs to provide the semiconductor structure shown in FIG. 4E.

Figure 4F:
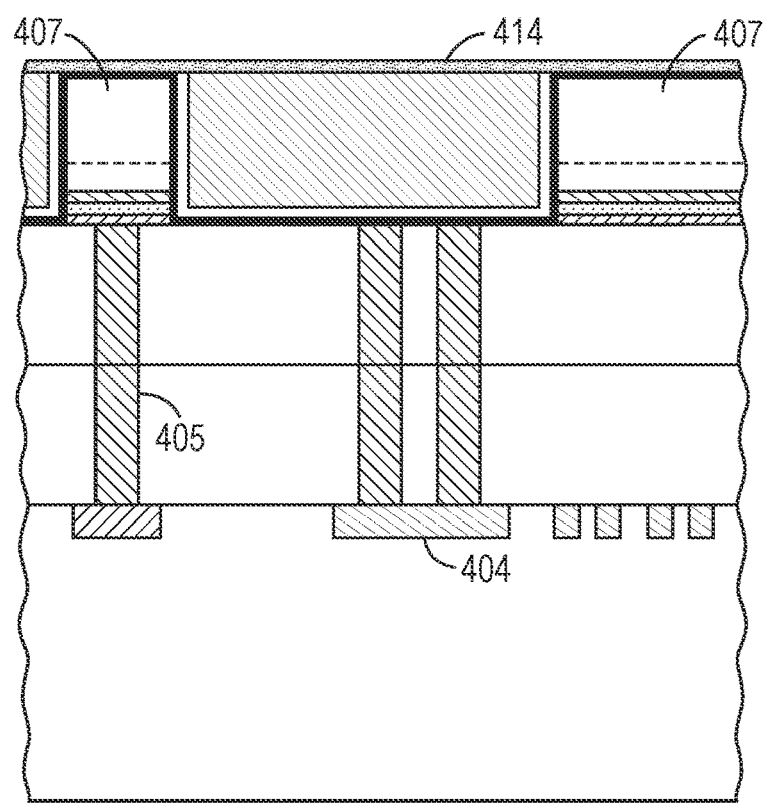

A transparent electrically conductive region 414 comprising, for example, a transparent electrically conductive oxide, can be deposited overlying the planarized surface to provide electrical contact between the common cathode contact pads 404 and each of the GaN-based LEDs 407. The transparent electrically conductive region can function as a current spreading layer. The resulting semiconductor structure is shown in FIG. 4F. Examples of suitable transparent electrically conductive materials include transparent conductive oxides. Examples of suitable transparent conductive oxides include $In_2O_3$:H (IO:H), InSnO (ITO), InZnO (a-IZO), $In_2O_3$:Zr (ZrIO); ZnO:Al (AZO), ZnSnO (a-ZTO), ZnO:B (BZO), ZnO:B (BZO), ZnO:Ga (GZO), $SnO_2$, ZnO, $CdSnO_2$, and CdO:In. For example, a transparent conductive oxide can be indium tin oxide (ITO). A transparent conductive oxide can have a thickness, for example, from 1 nm to 250 nm, from 10 nm to 250 nm, from 20 nm to 200 nm, or from 20 nm to 80 nm, and a refractive index of about 2.0.

The p-contact metal of each GaN-based LED can be interconnected through respective anode metal-filled vias to an independently addressable driver circuit through interconnects 405 and the n-doped region of the GaN-based LEDs to a common cathode 404 through transparent conductive oxide region 414. The semiconductor structure shown in FIG. 4F can be referred to as an integrated LED array.

FIGS. 5A-5D show an example of steps that can be used to fabricate a color conversion region overlying an integrated GaN-based LED array as shown in FIG. 4F.

A color conversion region refers to a structure configured to convert the wavelength of incident radiation such as light from an array of blue-emitting light emitting diodes (LED) to emit light within one or more different wavelength ranges such as, for example, light within the green and red wavelength ranges. A color conversion region can comprise a plurality of color conversion pixels and can comprise multiple layers including a color conversion region comprising the plurality of pixels and one or more other layers such as passivation layers, reflective layers, crosstalk minimizing layers, and/or focusing layers.

Figure 5A:
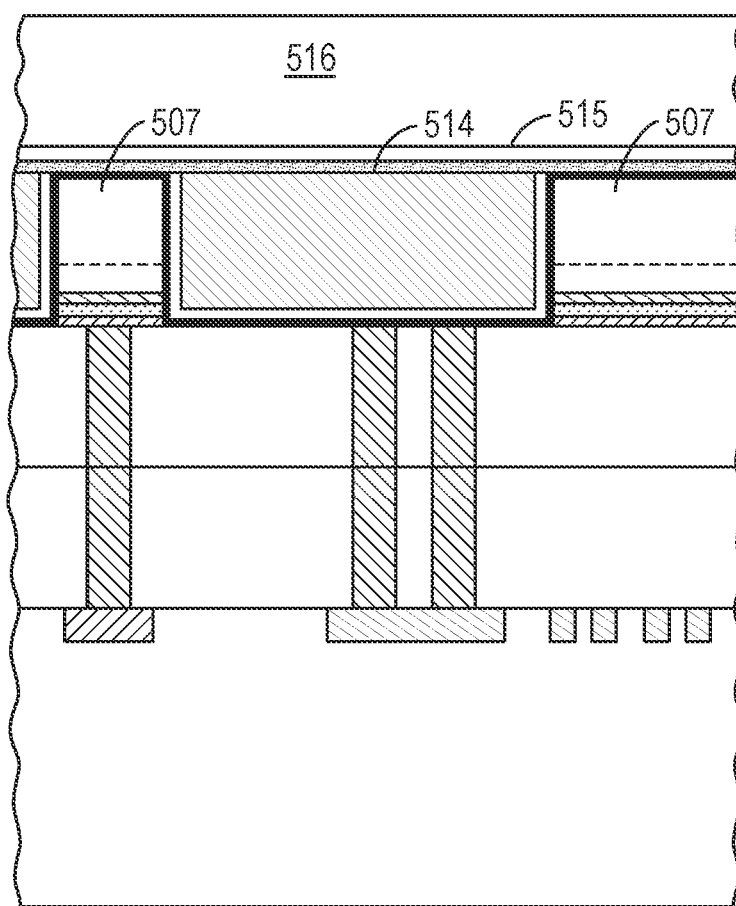
FIGS. 5A-5D show cross-sectional views of semiconductor structures used to fabricate a high-density LED display having an overlying color conversion region provided by the present disclosure.

Referring to FIG. 5A, to fabricate a color conversion region, a dielectric region 515 can be deposited overlying the transparent electrically conductive region 514. The dielectric region 515 can have a thickness, for example, or less than 10 μm or less than 5 μm. The dielectric region 515 can comprise, for example, $SiO_2$ or $SiN_x$.

A metal region 516 can then be deposited overlying the dielectric region 515 region of the semiconductor structure to provide the semiconductor structure shown in FIG. 5A. The metal region 516 can have a thickness, for example, less than 20 μm, less than 15 μm, less than 10 μm, or less than 5 μm. A metal region 516 can have a thickness, for example, from 0.5 μm to 20 μm, from 0.5 μm to 10 μm, from 0.5 μm to 5 μm, from 1 μm to 4 μm, or from 1 μm to 3 μm. The metal region 516 can comprise, for example, aluminum. The metal region 516 can comprise a metal that is reflective to radiation in the visible wavelength range.

Figure 5B:
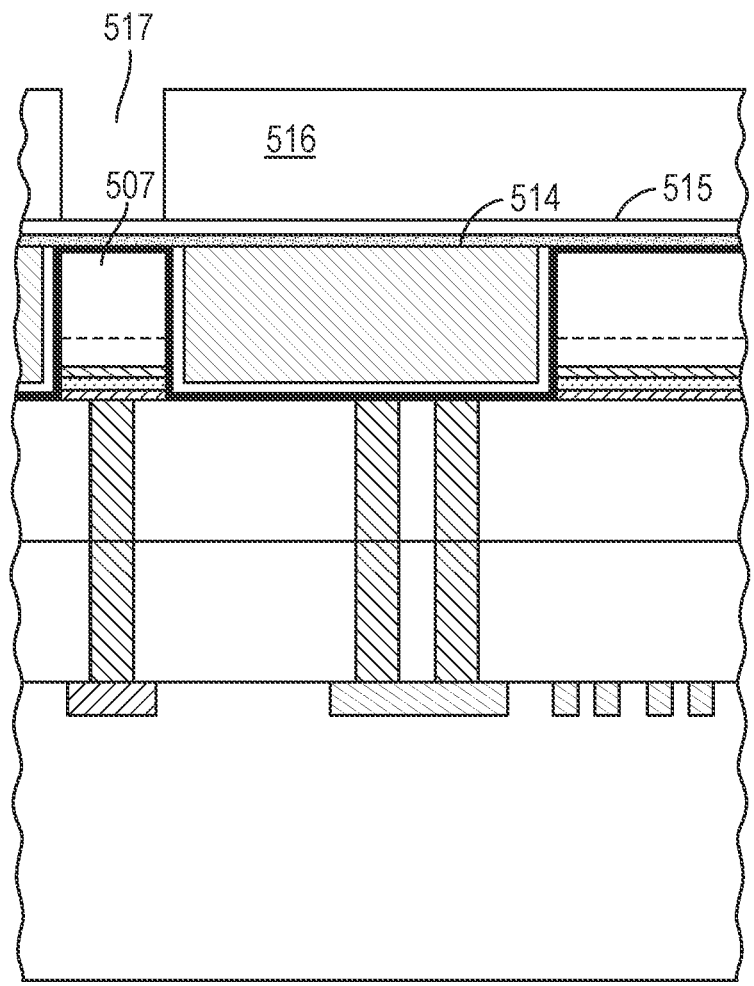

The portions of the metal region 516 between the GaN-based LEDs 507 can be etched to expose the dielectric region 515 overlying the GaN-based LEDs and to create cavities 517 as shown in FIG. 5B.

Figure 5C:
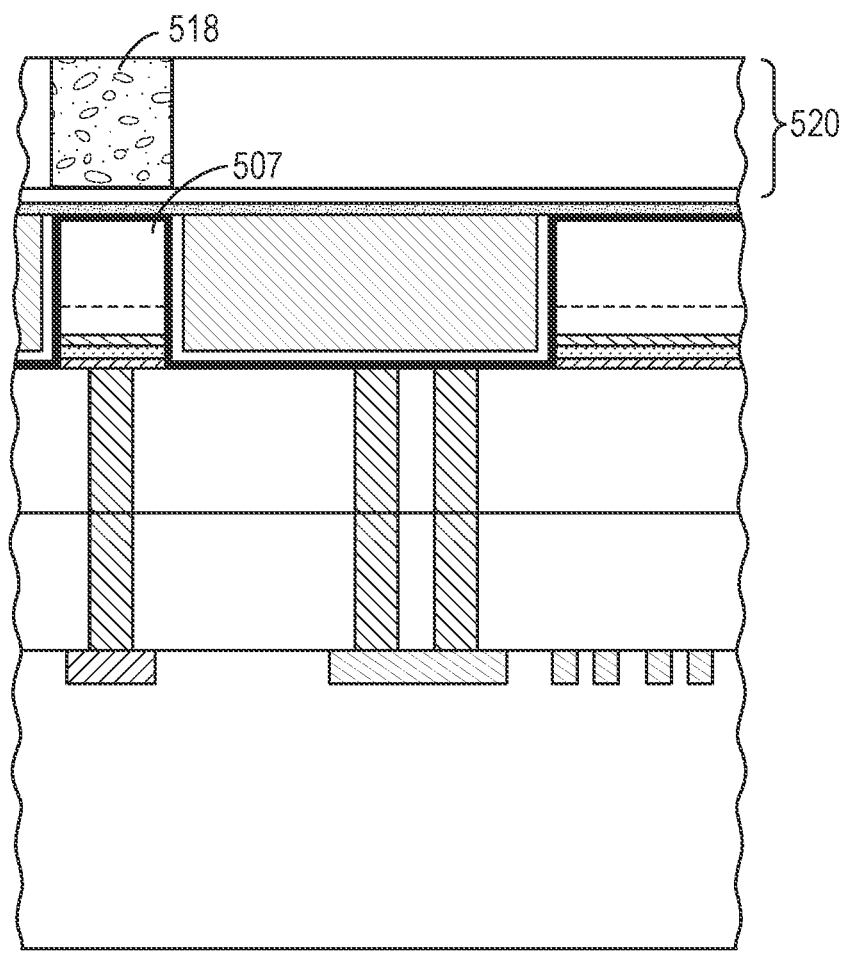

The cavities 517 can then be filled with a suitable color conversion material using a suitable method to provide color conversion pixels 518 and color conversion region 520 overlying the GaN-based LEDs 507 as shown in FIG. 5C.

Figure 5D:
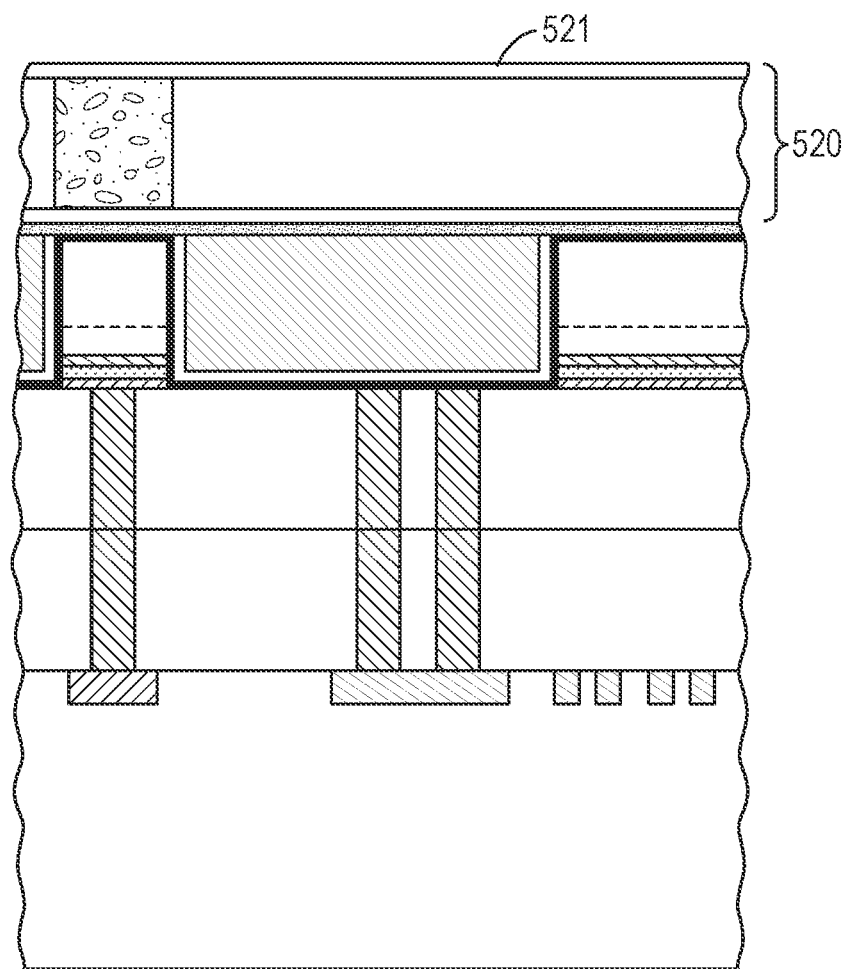

An optically transparent region 521 can be deposited over the planarized surface to provide the semiconductor structure shown in FIG. 5D including color conversion region 520. The optically transparent region 521 can comprise silicon dioxide or other optically transparent dielectric and can provide a hermetic seal.

FIG. 5D shows a cross-sectional view of an example of a high-density LED display provided by the present disclosure.

A wavelength-selective region such as a Bragg reflector (not shown) can be deposited overlying the color conversion pixels 518. A wavelength-selective region can be configured to transmit, for example, visible radiation or visible radiation within an intended range of visible wavelengths. A wavelength selective region can be configured, for example, to transmit radiation having wavelengths within the blue, red, or green wavelength ranges. A wavelength selective region can be configured to reflect wavelengths emitted by a GaN-based LED such as wavelengths within the blue wavelength range.

Examples of suitable color conversion materials include, for example, quantum dots. Quantum dots are semiconductor materials having a size, composition, and structure in which the electrical and optical characteristics differ from the bulk properties due to quantum confinement effects. Fluorescence of quantum dots results from the excitation of a valence electron by light absorption, followed by the emission at a lower energy wavelength as the excited electrons return to the ground state. Quantum confinement causes the energy difference between the valence and conduction bands to change depending on the size, composition and structure of a quantum dot. For example, the larger the quantum dot, the lower the energy of its fluorescence spectrum. The photoluminescence emission wavelength of a quantum dot can have a sharp emission spectrum and exhibit a high quantum efficiency.

A color conversion material can be applied to the cavities using, for example, ink jet printing, slot die coating, slit coating, screen printing, or spin coating.

The surface of the semiconductor structure can be planarized using, for example, chemical mechanical polishing.

A color conversion region can comprise a plurality of color conversion pixels, with at least some of the pixels comprising a plurality of quantum dots.

A volume fraction of quantum dots within a pixel can be from 10% to 70%, from 10% to 50%, such as from 10% to 40%, from 10% to 30%, or from 10% to 20%.

A color conversion region can have a thickness, for example, less than 5 μm, less than 2 μm, less than 1 μm, or less than 0.5 μm.

A color conversion region comprising the color conversion pixels can have a cross-sectional area, for example, from 0.2 mm² to 10 mm².

A color conversion region can be configured to convert incident light within an incident wavelength range to emitted light within one or more emitted wavelength ranges. For an optical display, the incident light can be in the blue wavelength range and the plurality of pixels can be selected to provide an acceptable color gamut for visual display. A four-color display designed to produce 100% of REC2020 can include, for example, red, green, blue and cyan pixels. A four-color display designed to preserve night vision can add a deep red (DR) pixel with a peak emission wavelength greater than about 720 nm.

For certain applications, it can be desirable that color converters provided by the present disclosure exhibit a quantum conversion efficiency from blue light at 455 nm to green or red light of greater than 80%, that the green and red pixels have less than 2% blue leakage through the green and red pixels, that the layer thickness be less than 2 μm, that the pixels be situated on a pitch of 3.3 μm or less, that the cross-talk or extinction ratio between adjacent pixels can be less than 1000:1, and that the color conversion layer be compatible with $SiO_2$ sealant technology and other dielectric films configured to provide a hermetic seal over a useful time frame.

In certain color conversion pixels blue light from the GaN-based LED array can be transmitted through a blue transmissive pixel. In certain color conversion pixels, GaN-based LEDs can emit at a wavelength range such as from 400 nm to 430 nm, and the blue pixels can comprise a plurality of quantum dots capable of absorbing in the wavelength range from 400 nm to 430 nm and emitting in the blue wavelength range, for example from 450 nm to 490 nm.

In certain GaN-based LED displays, a GaN-based LED array can emit in the near ultraviolet wavelength range, for example, from 300 nm to 400 nm or other suitable wavelength range.

In certain GaN-based LED displays, a GaN-based LED array can emit in the near IR wavelength range, for example, from 780 nm to 1700 nm or other suitable wavelength range and the quantum dots can absorb multiple low energy photons and up-convert to the desired visible wavelength.

In certain color conversion pixels, all or a portion of the plurality of pixels can comprise quantum dots capable of emitting in the red to near infrared wavelength range such as from 650 nm to 750 nm. Near infrared displays can be useful for night vision applications.

A color conversion region can comprise a plurality of pixels. For example, a color conversion region can comprise from 1,000 to 1,000,000 pixels, from 5,000 to 500,00 pixels, or from 10,000 to 100,000 pixels. A color conversion layer can comprise, for example, greater than 1,000 pixels, greater than 5,000 pixels, greater than 10,000 pixels, greater than 100,000 pixels, or greater than 1,000,000 pixels.

An alternative method for fabricating a color conversion region overlying an integrated GaN-based LED array is shown in FIGS. 6A-6H.

Figure 6A:
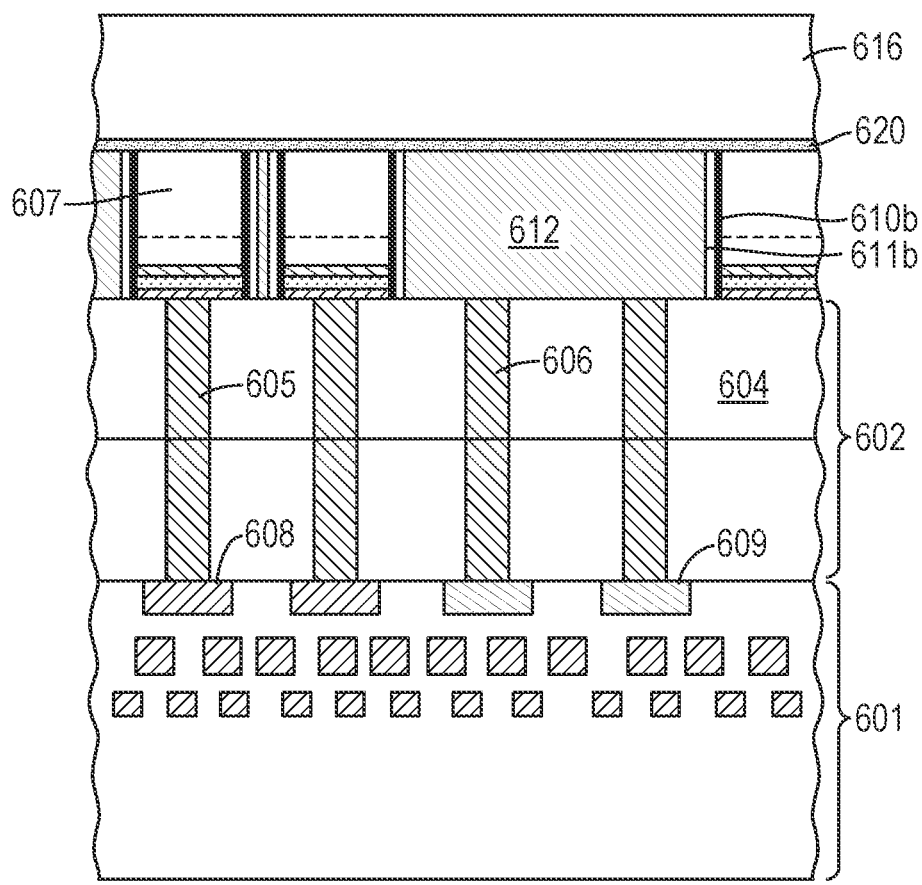
FIGS. 6A-6H show cross-sectional views of semiconductor structures used to fabricate a high-density LED display having an overlying color conversion region provided by the present disclosure.

Beginning with the integrated LED array shown in FIG. 4F, as shown in FIG. 6A, a thick dielectric region 616 can be deposited overlying the transparent electrically conductive region 620. The thick dielectric region 616 can comprise a photoresist. FIG. 6A shows interconnection substrate 601 including anode contact pads 608 and cathode contact pads 609, interconnection region 602 including metal-filled anode vias 605 and metal-filled cathode vias 606 within dielectric 604, GaN-based LEDs 607 and conductive metal 612 between the GaN-based LEDs 607, a dielectric region 610b overlying the sidewalls of the GaN-based LEDs and a reflective region 611b overlying the dielectric region 610b, a transparent conductive region 620 overlying the GaN-based LEDs 607 and the conductive metal 612, and a thick dielectric region 616 overlying the transparent electrically conductive region 620. Metal-filled vias 605 and 606 are formed using hybrid bonding and interconnect the p-contact of the GaN-based LEDs to an anode contact pad or interconnect the n-contact of the GaN-based LEDs to a cathode contact pad.

Figure 6B:
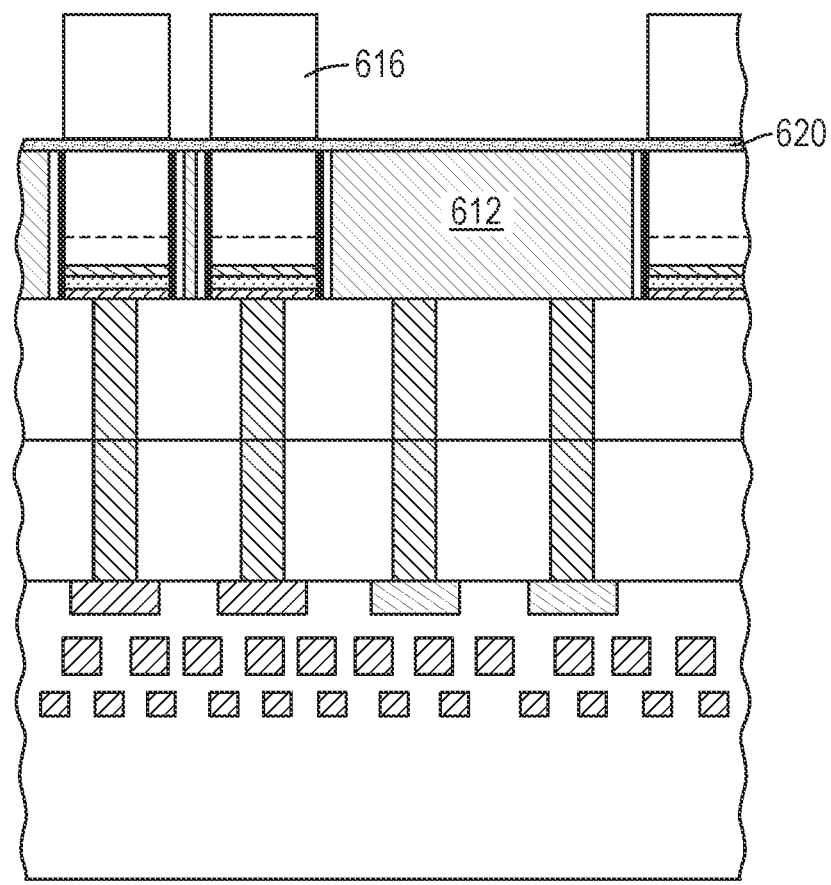
Figure 6C:
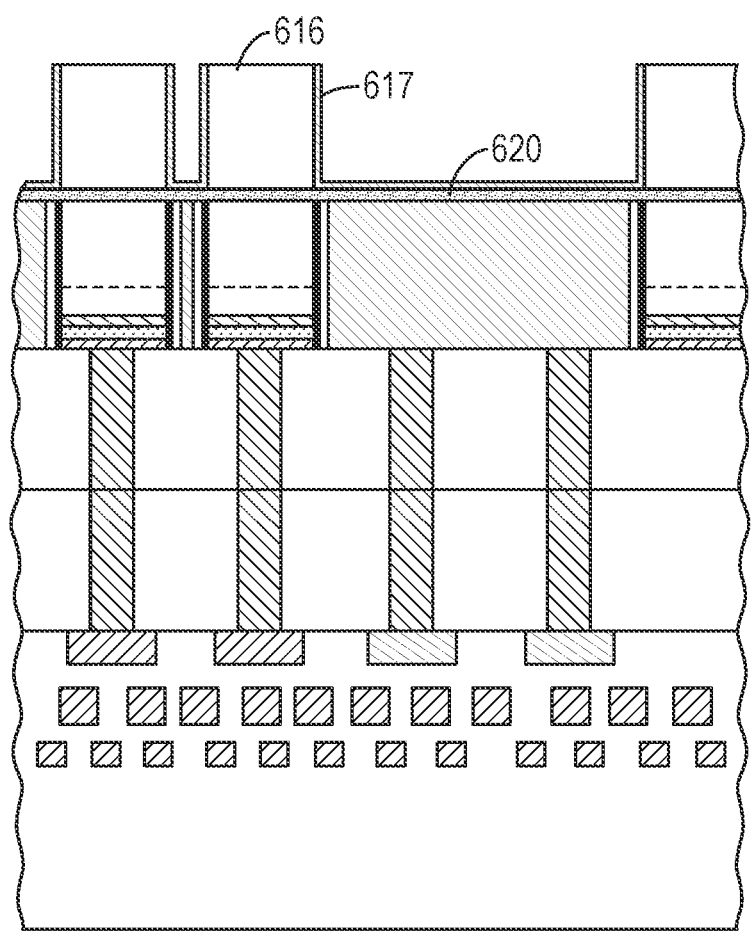
Figure 6D:
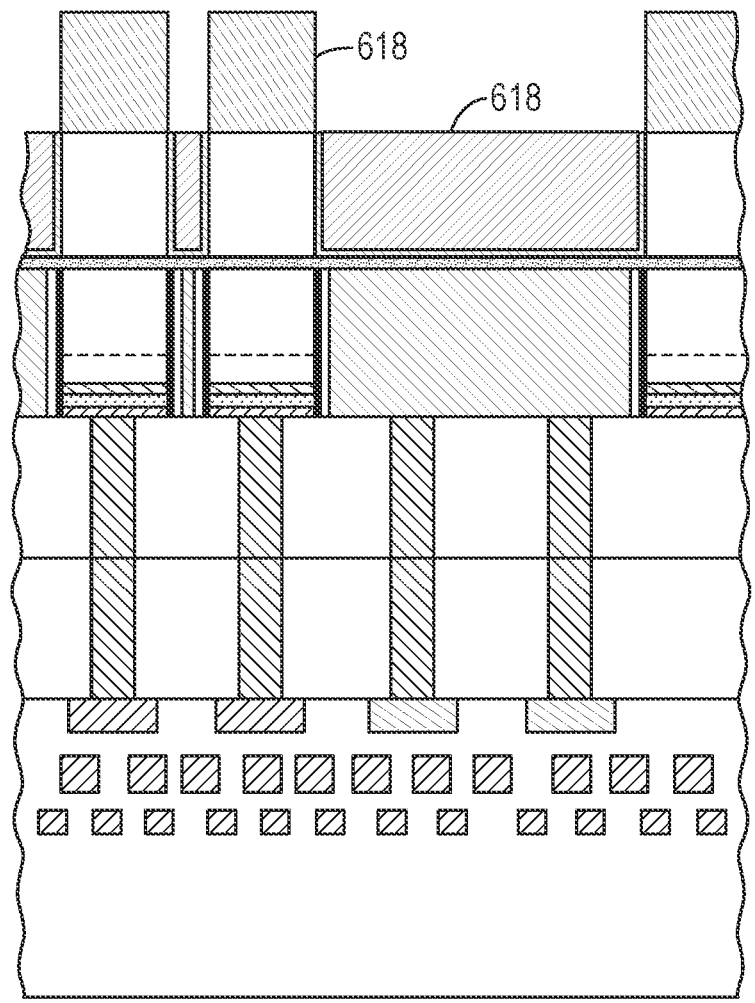
Figure 6E:
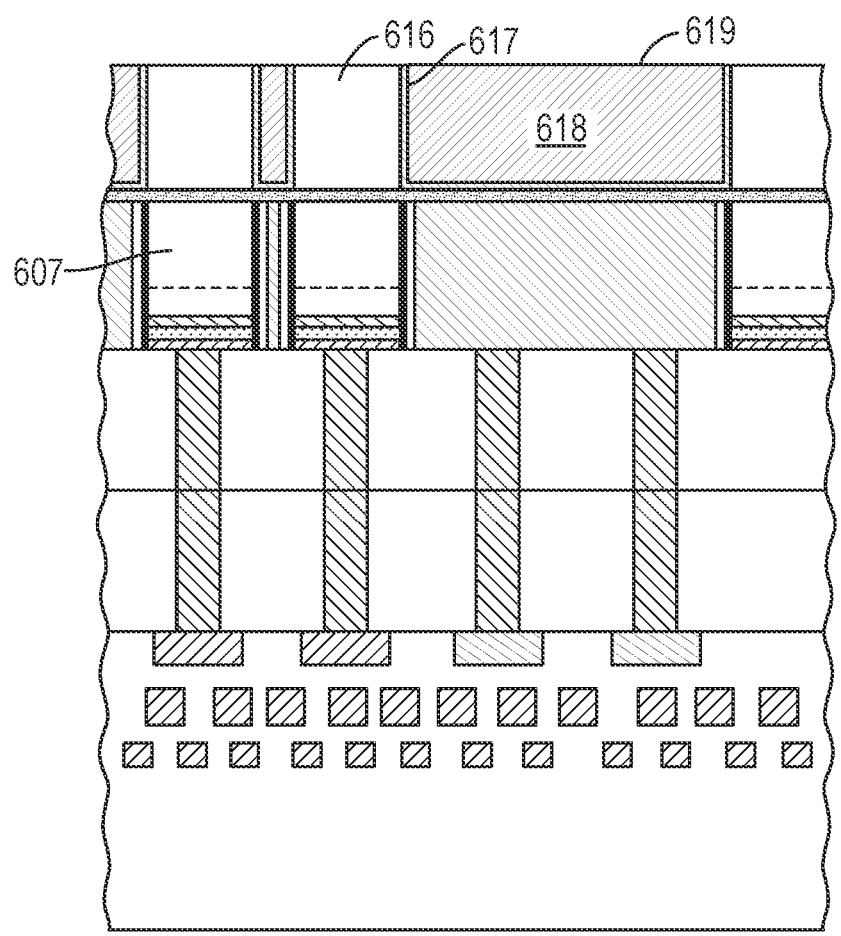
Figure 6F:
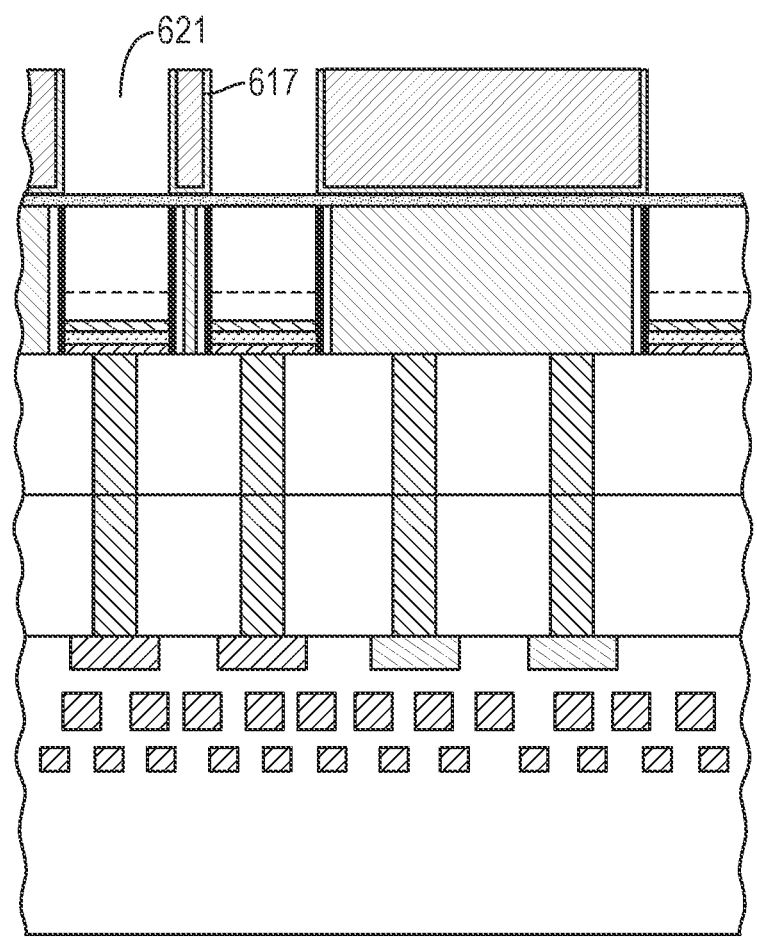

As shown in FIG. 6B the thick dielectric region 616 can be etched in the portions overlying the metal 612 to expose the transparent electrically conductive region 620. As shown in FIG. 6C a reflective metal region 617 can be deposited over the unetched dielectric regions 616 and overlying the transparent electrically conductive region 620. The reflective metal region 617 can be deposited using, for example, atomic layer deposition or sputtering and can comprise, for example, aluminum, iridium, or ruthenium. A metal 618 can be deposited to fill the trenches between the GaN-based LEDs and adjacent the GaN-based LEDs as shown in FIG. 6D. The metal can comprise, for example, copper. After planarization, as shown in FIG. 6E, the semiconductor structure comprises thick dielectric regions 616 overlying GaN-based LEDs 607, and metal 618 overlying portions between the thick dielectric regions 616. A reflective metal region 617 underlies the metal region 618 and separates the sidewalls of the metal region 618 from the dielectric regions 616. The thick dielectric region 616 can then be etched to leave cavities 621 with sidewalls lined with reflective metal region 617 as shown in FIG. 6F.

Figure 6G:
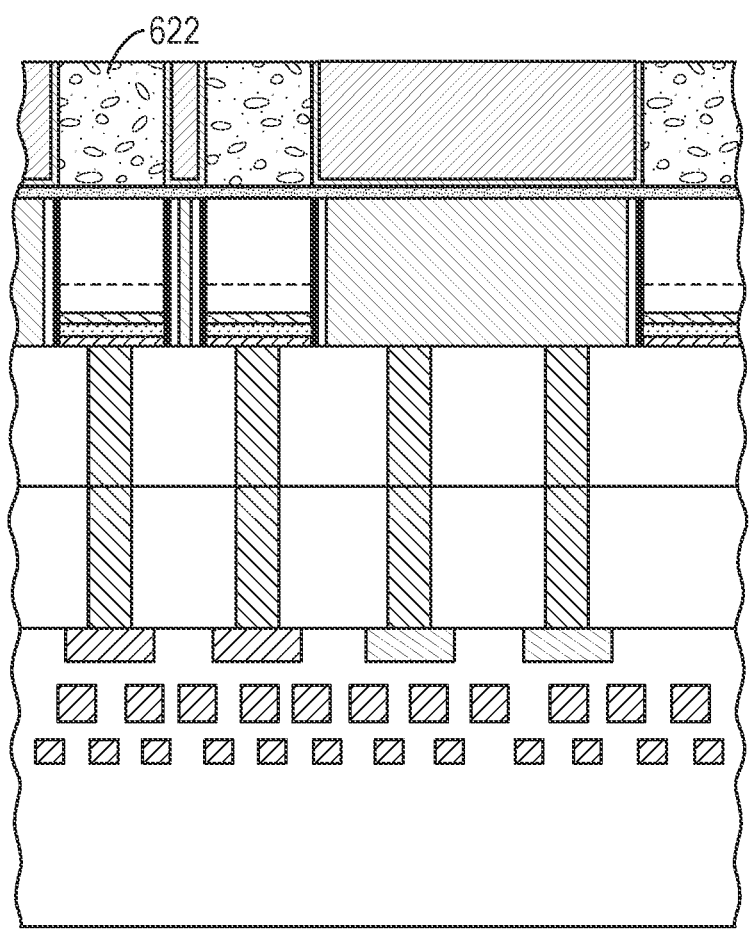
Figure 6H:
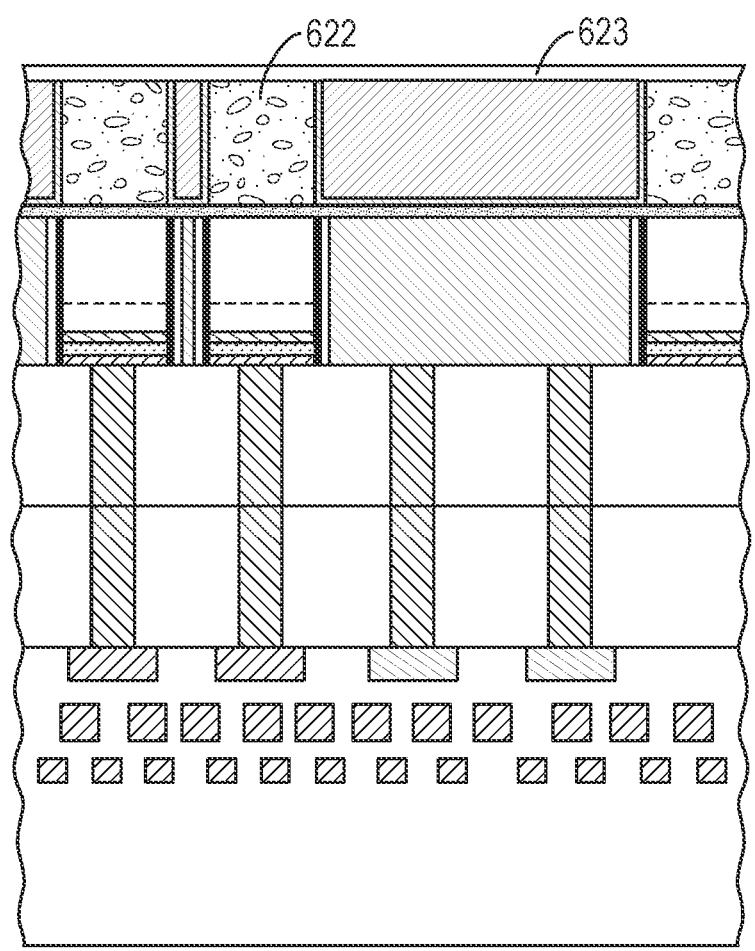

As described herein, the cavities 621 can be filled with a color conversion material 622 as shown in FIG. 6G and coated with an optically transparent region 623 such as silicon dioxide to provide a hermetic seal as shown in FIG. 6H.

FIG. 6H shows a cross-sectional view of an example of a high-density GaN-based LED display provided by the present disclosure.

Figure 7:
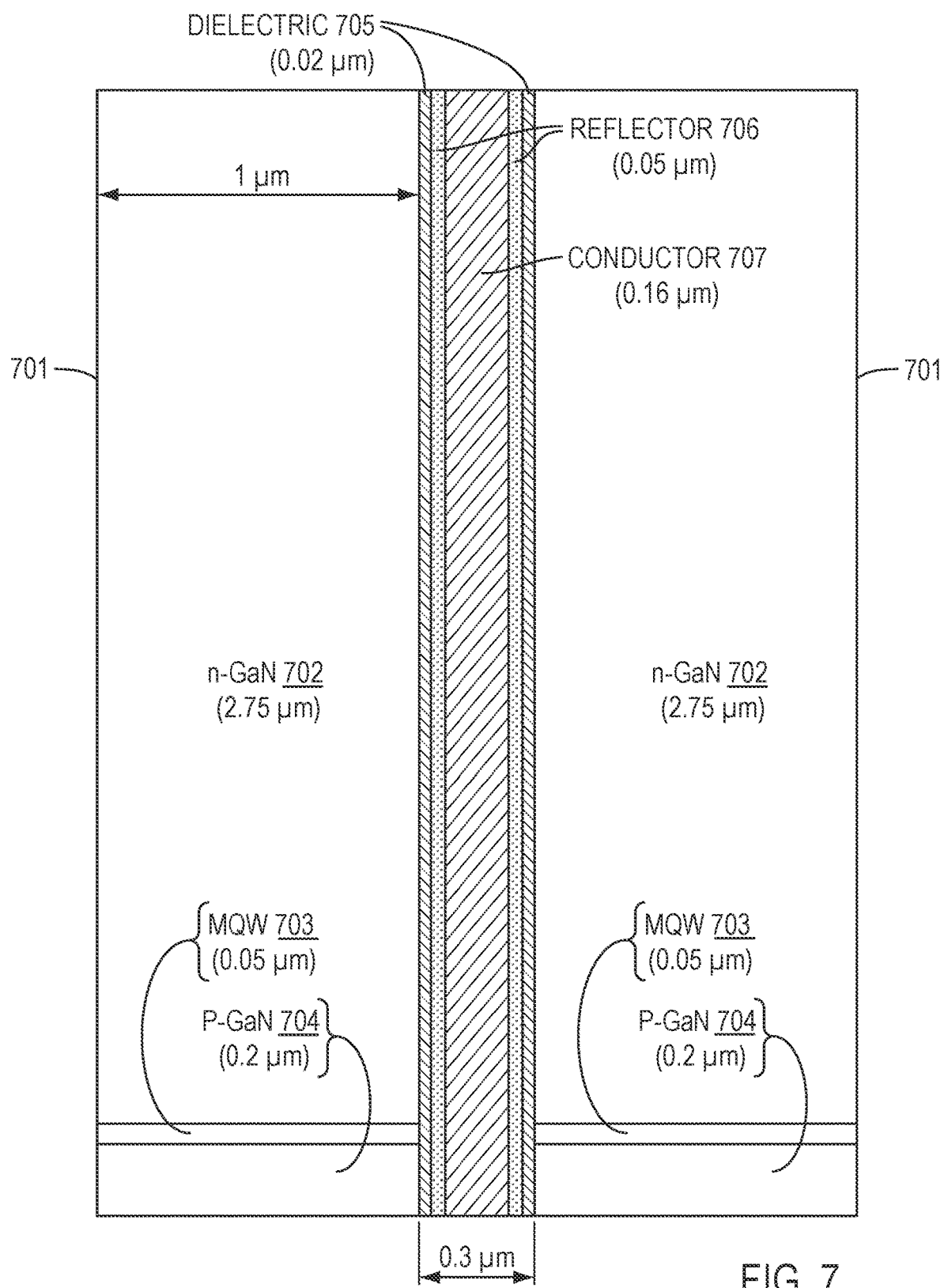
FIG. 7 shows a detailed cross-sectional view of an example of two adjacent GaN-based LEDs.

FIG. 7 shows a cross-sectional view of two adjacent GaN-based LEDs 701. FIG. 7 is drawn to scale using specific dimensions, however, other suitable dimensions for the structures can be used. As shown in FIG. 7 the GaN-based LEDs 701 include 2.75 μm of n-doped GaN 702, 0.05 μm of an InGaN multiple quantum well (MQW) active region 703, and 0.2 μm of p-doped GaN 704. Light can be generated by the InGaN-MQW active region 703, such that the optical path from the InGaN-MQW active region 703 to the GaN-based GaN-based LED aperture at the far end of the n-doped region 702 is 2.75 μm long. For embodiments in which the GaN-based LED is 1 μm wide, the optical path has a height:width aspect ratio of 2.75:1. Light can reflect multiple times from the sidewalls before reaching the LED aperture.

The sidewalls of the GaN-based LEDs 701 can be coated, for example, with a 0.02 µm thick dielectric 705, a 0.05 µm thick reflective metal layer 706, and a 0.16 µm thick metal fill 707, which provides structural support and can also provide electrical connection to the common cathode pads.

With reference to FIG. 7, the various structures can have any other suitable dimensions. For example, the gap between adjacent GaN-based LEDs can be from 0.2 µm to 1 µm, the dielectric layer 704 can have a thickness from 0.01 µm to 0.05 µm, and the reflective metal layer can have a thickness from 0.03 µm to 0.10 µm. For example, the n-GaN region 702 can have a thickness from 1 µm to 5 µm, the InGaN-MQW region can have a thickness from 0.025 µm to 0.075 µm, and the p-GaN a region 706 can have a thickness from 0.1 µm to 0.3 µm. A p-contact metal such as indium tin oxide, Ag, or NiAu, can underly the GaN region and can have a thickness, for example, less than 50 nm.

A femtoprojector provided by the present disclosure can be incorporated into a contact lens such as a scleral contact lens that can be worn over an eye of a user.

Figure 8:
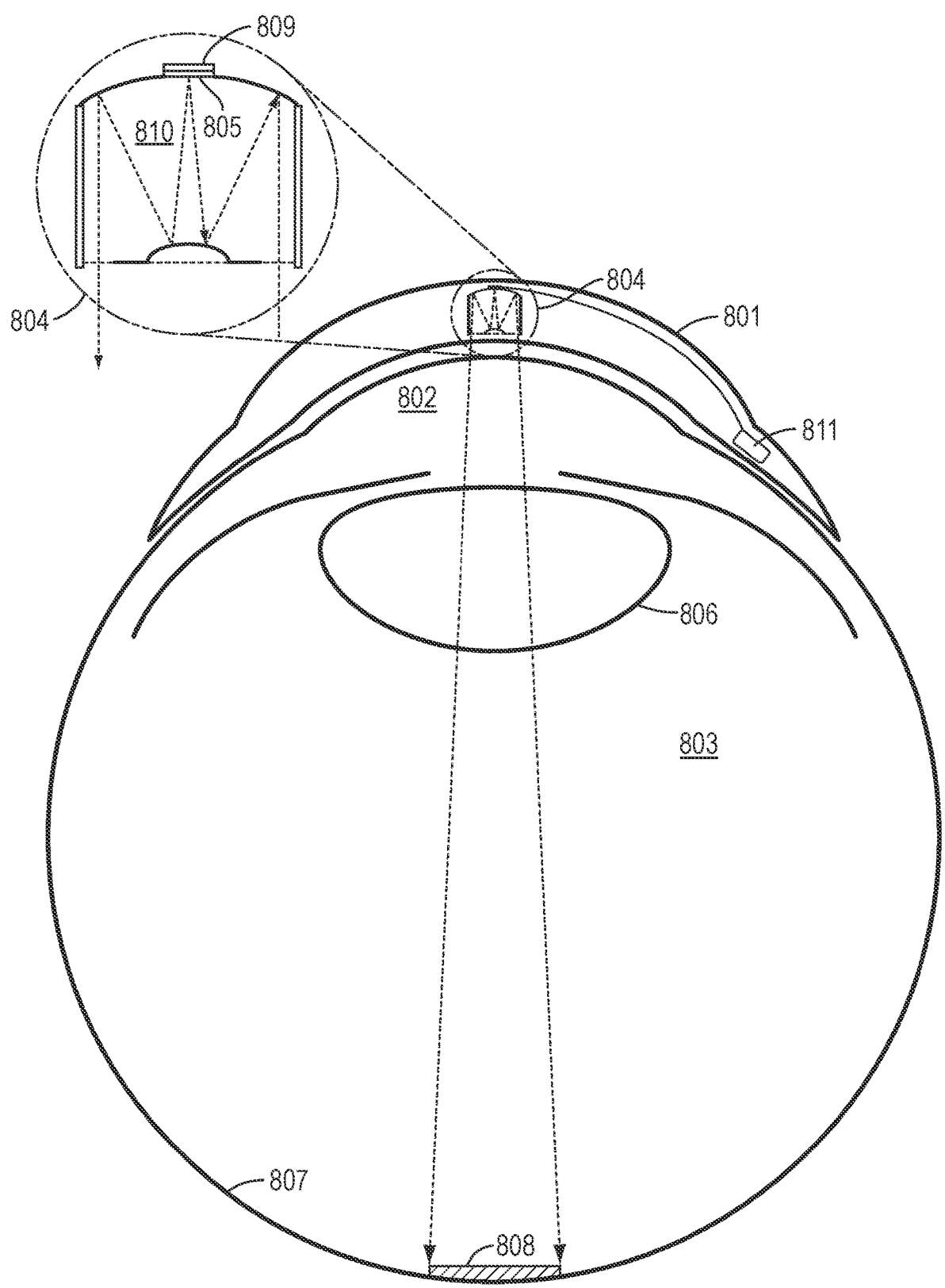
FIG. 8 shows a cross-sectional view of an example of a scleral contact lens incorporating a femtoprojector and a high-density GaN-based LED array provided by the present disclosure.

An example of a femtoprojector display incorporated into a scleral contact lens is shown in FIG. 8. FIG. 8 shows scleral contact lens 801 worn over a cornea 802 of eye 803. When worn over the eye, femtoprojector 804 can be configured to project an image from the high-density GaN-based LED display 705 through cornea 802 and lens 806 onto retina 807 to provide a retinal image 808.

Femtoprojector 804 including GaN-based LED display 805, electronic interface such as an application specific integrated circuit (ASIC) 809, and optical system 810 can have a total volume, for example, less than 3 mm³, such as less than 2 mm³ or less than 1 mm³.

A femtoprojector display can have, for example, a 330×300 array of pixels, a 250×250 array of pixels, a 200×200 array of pixels, a 150×150 array of pixels or any other suitable pixel array dimensions.

A femtoprojector display can have, for example, from 100,000 pixels to 1,000,000 pixels.

A femtoprojector display can be, for example monochromatic, or can be a three-color display, having, for example, red, blue and green pixels.

Finally, it should be noted that there are alternative ways of implementing the embodiments disclosed herein. Accordingly, the present embodiments are to be considered as illustrative and not restrictive. Furthermore, the claims are not to be limited to the details given herein and are entitled to their full scope and equivalents thereof.

What is claimed is:

1. A high-density light emitting diode (LED) display comprising:
   a backplane substrate comprising anode contact pads and cathode contact pads;
   an interconnection region overlying the backplane substrate, wherein the interconnection region comprises:
      a frontplane interconnection region comprising frontplane vertical interconnects;
      a backplane interconnection region comprising backplane vertical interconnects; and
      a hybrid bonding interface between the frontplane interconnection region and the backplane interconnection region, wherein,
         the frontplane vertical interconnects are aligned with respective backplane vertical interconnects;
         each of the vertical interconnects is electrically connected to an anode contact pad or to a cathode contact pad; and
         each of the frontplane vertical interconnects and the backplane vertical interconnects comprise copper-filled vias,
   an LED region overlying the interconnection region, wherein the LED region comprises LEDs and an electrically conductive metal between each of the LEDs;
   a transparent electrically conductive region overlying the LED region, wherein the transparent electrically conductive region is electrically connected to each of the LEDs and to the electrically conductive metal between each of the LEDs;
   a dielectric region overlying the transparent electrically conductive region; and
   a color conversion region overlying the dielectric region, wherein the color conversion region comprises:
      a metal layer overlying the transparent electrically conductive region; and
      a color conversion pixel formed within the metal layer and overlying each LED.

2. The high-density light emitting diode (LED) display of claim 1, wherein;
   each of the LEDs is electrically connected to an anode contact pad through a metal-filled anode via; and
   the electrically conductive metal between each of the LEDs is electrically connected to the cathode contact pads through the metal-filled cathode vias.

3. The high-density light emitting diode (LED) display of claim 1, wherein each of the LEDs comprises sidewalls, and further comprising:
   a sidewall dielectric region overlying the LED sidewalls; and
   a sidewall reflective region overlying the sidewall dielectric region.

4. The high-density light emitting diode (LED) display of claim 1, further comprising a protective cap region overlying the color conversion region.

5. The high-density light emitting diode (LED) display of claim 1, wherein the LEDs comprise GaN-based LEDs.

6. The high-density light emitting diode (LED) display of claim 1, wherein the backplane substrate comprises a silicon CMOS substrate.

7. The high-density light emitting diode (LED) display of claim 1, wherein the interconnection region comprises silicon dioxide.

8. The high-density light emitting diode (LED) display of claim 1, wherein the LED region has a thickness less than 4 µm.

9. The high-density light emitting diode (LED) display of claim 1, wherein the LEDs have a maximum width less than 0.4 µm and a thickness less than 5 µm.

10. A high-density light emitting diode (LED) display comprising:
   a backplane substrate comprising anode contact pads and cathode contact pads;
   a frontplane interconnection region comprising frontplane vertical interconnects;
   a backplane interconnection region comprising backplane vertical interconnects; and
   a hybrid bonding interface between the frontplane interconnection region and the backplane interconnection region, wherein,
      the frontplane vertical interconnects are aligned with respective backplane vertical interconnects;
      each of the vertical interconnects is electrically connected to an anode contact pad or to a cathode contact pad; and each of the frontplane vertical interconnects and the backplane vertical interconnects comprise copper-filled vias,
an LED region overlying the interconnection region, wherein the LED region comprises LEDs and an electrically conductive metal between each of the LEDs;
a transparent electrically conductive region overlying the LED region, wherein,
the transparent electrically conductive region is electrically connected to each of the LEDs and to the electrically conductive metal between each of the LEDs; and
the electrically conductive metal is electrically connected to the cathode contact pads through a metal-filled cathode via; and
a color conversion region overlying the transparent electrically conductive region, wherein the color conversion region comprises:
a color conversion pixel overlying a first portion of the transparent conductive oxide region and overlying each of a respective LED;
a reflective metal region overlying a second portion of the transparent electrically conductive region; and
a metal between each of the color conversion pixels.

11. The high-density light emitting diode (LED) display of claim 10, wherein the color conversion pixels comprise sidewalls, and the reflective metal region further overlies the pixel sidewalls.

12. The high-density light emitting diode (LED) display of claim 10, wherein,
each of the LEDs is electrically connected to an anode contact pad through a metal-filled anode via; and
the electrically conductive metal between each of the LEDs is electrically connected to the cathode contact pads through the metal-filled cathode vias.

13. The high-density light emitting diode (LED) display of claim 10, wherein each of the LEDs comprises sidewalls, and further comprising:
an LED sidewall dielectric region overlying the LED sidewalls; and
an LED sidewall reflective region overlying the LED sidewall dielectric region.

14. The high-density light emitting diode (LED) display of claim 10, further comprising a protective cap region overlying the color conversion region.

15. The high-density light emitting diode (LED) display of claim 10, wherein the LEDs comprise GaN-based LEDs.

16. The high-density light emitting diode (LED) display of claim 10, wherein the substrate comprises a silicon interconnection substrate.

17. The high-density light emitting diode (LED) display of claim 10, wherein the interconnection region comprises silicon dioxide.

18. The high-density light emitting diode (LED) display of claim 10, wherein the LEDs have a maximum with less than 0.4 μm and a thickness less than 5 μm.

* * * * *